(12) United States Patent
Satou et al.

(10) Patent No.: US 11,842,866 B2
(45) Date of Patent: Dec. 12, 2023

(54) PRESSURE MONITORING DEVICE AND PRESSURE MONITORING METHOD FOR VACUUM VALVE

(71) Applicant: Hitachi Industrial Equipment Systems Co., Ltd., Tokyo (JP)

(72) Inventors: Kazuhiro Satou, Tokyo (JP); Takashi Sato, Tokyo (JP); Shindai Satou, Tokyo (JP); Masanori Shishido, Tokyo (JP)

(73) Assignee: HITACHI INDUSTRIAL EQUIPMENT SYSTEMS CO., LTD., Tokyo (JP)

( * ) Notice: Subject to any disclaimer, the term of this patent is extended or adjusted under 35 U.S.C. 154(b) by 344 days.

(21) Appl. No.: 17/420,208

(22) PCT Filed: Apr. 22, 2019

(86) PCT No.: PCT/JP2019/016923
§ 371 (c)(1),
(2) Date: Jul. 1, 2021

(87) PCT Pub. No.: WO2020/179089
PCT Pub. Date: Sep. 10, 2020

(65) Prior Publication Data
US 2022/0068579 A1 Mar. 3, 2022

(30) Foreign Application Priority Data

Mar. 4, 2019 (JP) .................................. 2019-038254

(51) Int. Cl.
*H01H 33/668* (2006.01)
*G01R 31/327* (2006.01)

(52) U.S. Cl.
CPC ......... *H01H 33/668* (2013.01); *G01R 31/327* (2013.01)

(58) Field of Classification Search
CPC ................. H01H 33/668; H01H 33/66; H01H 2033/6623; G01R 31/327; G01R 31/3275
See application file for complete search history.

(56) References Cited

U.S. PATENT DOCUMENTS 5,399,973 A 3/1995 Kitamura

FOREIGN PATENT DOCUMENTS

| EP | 1763049 A1 * | 3/2007 | ........... H01H 33/668 |
| JP | 57-148830 A | 9/1982 | |

(Continued)

OTHER PUBLICATIONS

International Search Report of PCT/JP2019/016923 dated Jul. 30, 2019.

*Primary Examiner* — Eric S. McCall
*Assistant Examiner* — Timothy P Graves
(74) *Attorney, Agent, or Firm* — MATTINGLY & MALUR, PC

(57) ABSTRACT

To provide a vacuum valve pressure diagnosis device for an opening/closing device equipped with a vacuum valve, the diagnosis device which permits downsizing of the vacuum valve and achieves enhanced safety and reliability. Accordingly, the vacuum valve pressure monitoring device is disposed in a vacuum breaker including: a main circuit opening/closing part including the vacuum valve and an insulating frame covering the vacuum valve; and an operation mechanism part for opening/closing a contact of the vacuum valve. The pressure monitoring device for vacuum valve includes: a first electrode disposed on one side surface of the insulating frame and grounded via an impedance; a second electrode disposed on another side surface of the insulating frame and grounded via a switch; and a potential measuring device connected in between the impedance and the first electrode.

5 Claims, 3 Drawing Sheets

(56) References Cited

FOREIGN PATENT DOCUMENTS

| | | | |
|---|---|---|---|
| JP | 06-060780 A | | 3/1994 |
| JP | 10-09227 A | | 4/1998 |
| JP | 2012-156117 A | | 8/2012 |
| JP | 2012156117 A | * | 8/2012 |
| WO | 2012/066792 A1 | | 5/2012 |
| WO | WO-2017022509 A1 | * | 2/2017 ............. H01H 33/00 |

* cited by examiner

PRESSURE MONITORING DEVICE AND PRESSURE MONITORING METHOD FOR VACUUM VALVE

TECHNICAL FIELD

The present invention relates to a pressure diagnosis device for diagnosing degradation of internal pressure of a vacuum valve as well as to a pressure monitoring method.

BACKGROUND ART

There is known PTL 1 pertaining to the related art of the pressure diagnosis device for vacuum valve.

In the abstract of this patent literature, the following vacuum down detection device is set forth as means for "providing a device for vacuum down detection which does not use a high voltage capacitor but is capable of accurate detection of abnormal electrical discharge due to loss of vacuum in the vacuum valve, and which therefore has a simple and compact configuration." The detection device includes: "a built-in external electrode insulated and supported on an outer peripheral part of an insulating container in a manner to be opposed to a metal shield; and a shunt capacitor connected in between the built-in external electrode and the ground, and is adapted to detect an abnormal electrical discharge based on a terminal voltage of the shunt capacitor."

CITATION LIST

Patent Literature

PTL 1: Japanese Patent Application Laid-Open No. Hei 10-92277

SUMMARY OF INVENTION

Technical Problem

Although the loss of vacuum in the vacuum valve can also be detected by the vacuum down detection device of PTL 1, the configuration set forth in the above literature has a drawback of degradation of insulation performance of an external part of the vacuum valve because the external electrode is exposed from an outside container wall of the insulating container constituting the vacuum valve. More specifically, there is a fear of dielectric breakdown between one of a charged stationary side end plate and a charged movable side end plate of the vacuum valve and an external electrode, or between the both end plates and the external electrode. This problem can be solved by increasing the distance between each of the end plates and the external electrode. However, this approach leads to another problem that the total length of the vacuum valve is increased more than necessary.

In this connection, an object of the present invention is to provide a pressure diagnosis device for vacuum valve which can be downsized and is enhanced in the reliability of electrical insulation, as well as a pressure diagnosis method therefor.

Solution to Problem

According to an aspect of the present invention for achieving the above object, a vacuum valve pressure monitoring device is disposed in a vacuum breaker including: a main circuit opening/closing part including a vacuum valve and an insulating frame covering the vacuum valve; and an operation mechanism part for opening/closing a contact of the vacuum valve, and includes: a first electrode disposed on one side surface of the insulating frame and grounded via an impedance; a second electrode disposed on another side surface of the insulating frame and grounded via a switch; and a potential measuring device connected in between the impedance and the first electrode.

According to another aspect of the present invention, a method for monitoring vacuum valve pressure is for a vacuum breaker including: a main circuit opening/closing part including a vacuum valve and an insulating frame covering the vacuum valve; and an operation mechanism part for opening/closing a contact of the vacuum valve, and is arranged to monitor the degradation of internal pressure of the vacuum valve by taking measurement of a potential between two electrodes in a state where a switch is turned on, the two electrodes including: a first electrode disposed on one side surface of the insulating frame and grounded via an impedance; and a second electrode disposed on another side surface of the insulating frame and grounded via the switch.

Advantageous Effects of Invention

According to the present invention, the vacuum valve pressure diagnosis device which permits the downsizing of the vacuum valve and is enhanced in the reliability for electrical insulation as well as the pressure diagnosis method therefor can be provided.

DESCRIPTION OF EMBODIMENTS

A vacuum valve pressure monitoring device and a pressure monitoring method according to the examples of the present invention will hereinbelow be described with reference to the accompanying drawings. It is noted that the following description is absolutely the illustration of preferred examples of the present invention but does not mean to limit the application object of the present invention.

Example 1

Figure 1:
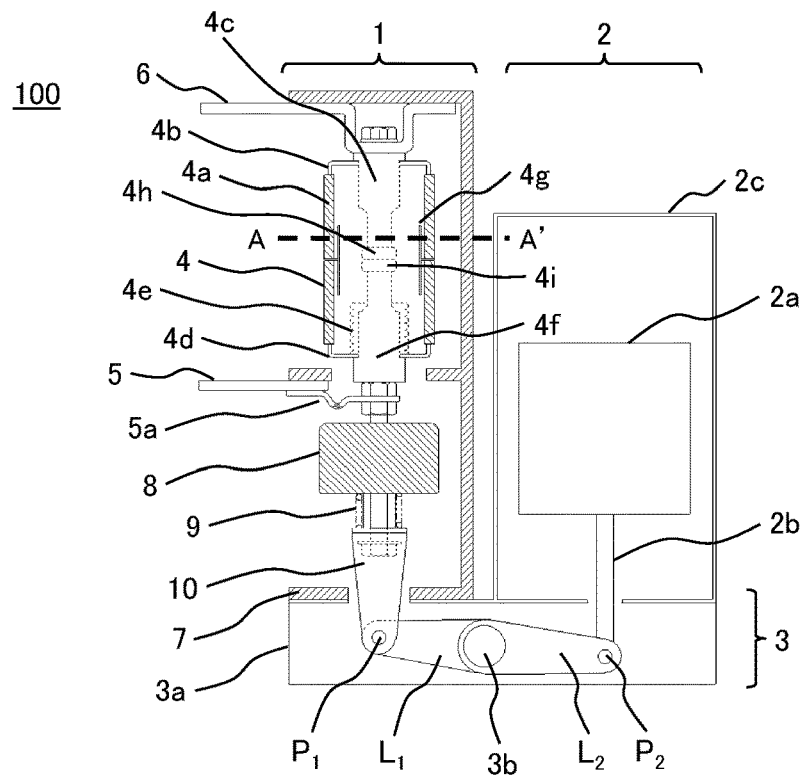
FIG. 1 is a schematic diagram showing a vacuum breaker according to Example 1.
Figure 2:
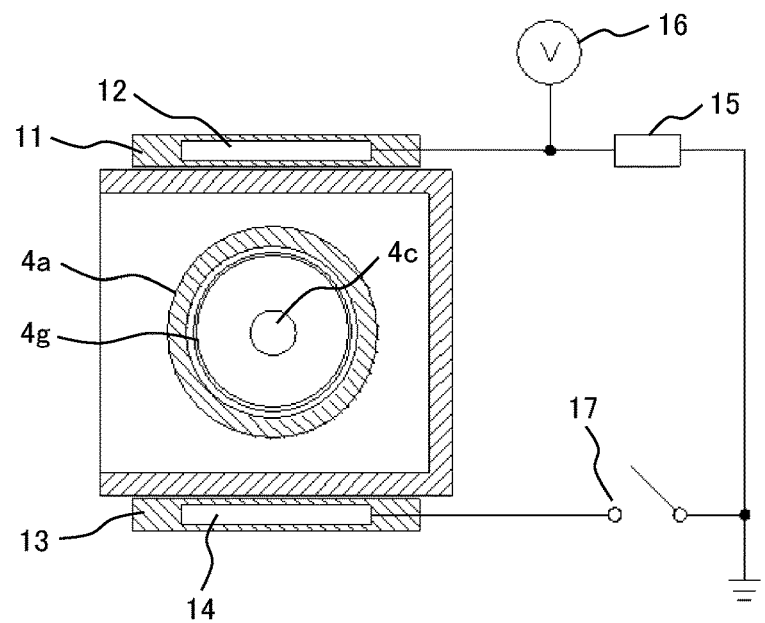
FIG. 2 is a schematic diagram showing a pressure monitoring device according to Example 1.

FIG. 1 and FIG. 2 show a vacuum breaker 100 equipped with a pressure monitoring device according to Example 1. FIG. 1 is a plan view showing an on-state vacuum breaker. FIG. 2 is a sectional view taken on the line A-A' in FIG. 1.

As shown in FIG. 1, the vacuum breaker 100 of the example generally includes: a main circuit opening/closing part 1 on the left side as seen in the figure; an operation mechanism part 2 on the right side as seen in the figure; and a link mechanism part 3 on the under side as seen in the figure.

The main circuit opening/closing part 1 includes: a vacuum valve 4 including a pair of on-off switchable contacts (stationary side electrode 4h and movable side electrode 4i to be described hereinafter); a movable side connecting conductor 5; a flexible conductor 5a for electrically connecting the vacuum valve 4 and the movable side connecting conductor 5; a stationary side connecting conductor 6; an insulating frame 7 for electrically insulating these conductors from the operation mechanism part 2 and the link mechanism part 3; an insulating rod 8 for vertically moving a movable side of the vacuum valve 4 as seen in the figure; a contact pressure spring 9 for applying a contact load on the contact in the vacuum valve; and a lever connection fitting 10 for pushing up the contact pressure spring 9.

The vacuum valve 4 includes: a stationary side end plate 4b joined to one end of a cylindrical insulating material 4a; a stationary side conductor 4c hermetically penetrating through the stationary side end plate 4b; a movable side end plate 4d joined to the other end of the cylindrical insulating material 4a; an accordion bellows 4e having one end joined to the movable side end plate 4d so as to allow a movable portion thereof to be driven; and a movable side conductor 4f hermetically penetrating through the bellows 4e so as to axially drive the bellows while maintaining the vacuum. The internal pressure of the vacuum valve is maintained at a vacuum level roughly in the range of $10^{-2}$ Pa or less. Further, in this vacuum valve 4, a cylindrical floating potential metal 4g supported by the cylindrical insulating material 4a, the stationary side electrode 4h connected to the stationary side conductor 4c at its end on the side of the movable side conductor 4f, and the movable side electrode 4i connected to the movable side conductor 4f at its end on the side of the stationary side conductor 4c are disposed.

The operation mechanism part 2 includes an operation unit 2a, a drive rod 2b vertically working in conjunction with the driving by the operation unit 2a, and an operation unit case 2c accommodating these components. The operation unit 2a, the illustration of which is omitted, is constituted by a solenoid operation type operation unit using a permanent magnet, a coil, and a breaking spring, a spring operation type operation unit which uses a making spring in place of the permanent magnet and coil and in which the making spring and the breaking spring are each retained by a latch mechanism, or the like.

The link mechanism part 3 includes a link mechanism part case 3a, a shaft 3b rollably born by the case, and levers $L_1$, $L_2$. The lever $L_1$ has one end thereof secured to the shaft 3b and has the other end thereof coupled to the lever connection fitting 10 by means of a pin $P_1$. The $L_2$ has one end secured to the shaft 3b and has the other end coupled to the drive rod 2b of the operation mechanism part 2 by means of a pin $P_2$.

According to the above-described configuration, the vertical motion of the drive rod 2b of the operation mechanism part 2 is transferred to a movable side of the vacuum valve 4 by means of the levers $L_1$, $L_2$, so that the contacts of the vacuum valve 4 are opened or closed. Namely, the connection between the stationary side electrode 4h and the movable side electrode 4i, which will be described hereinafter, is controlled.

Now, a description is made on a case where the internal pressure of the vacuum valve 4 is degraded, or where the pressure in the vacuum container rises. In general, the pressure rise in the vacuum container is mainly caused by gas permeation from the outside of the vacuum container, gas release from some internal component of the vacuum container, and pinhole rarely produced in the bellows, joints, or the like. In a case where contact spacing is 5 mm, for example, insulation performance starts declining sharply when the pressure is roughly $10^{-1}$ Pa or more, as indicated by Paschen curve.

If the vacuum valve 4 is lowered in the insulation performance due to the pressure rise of the vacuum valve 4 when the vacuum breaker 100 equipped with the vacuum valve 4 is in normal operation, electric discharge occurs between a main circuit in the vacuum valve 4 (the stationary side conductor 4c, the stationary side electrode 4h, the movable side conductor 4f, and the movable side electrode 4i) and the floating potential metal 4g electrically insulated from this main circuit.

It is noted here that the potential of the floating potential metal 4g during the normal operation when the vacuum valve 4 does not suffer the pressure rise roughly depends upon driving voltage, vacuum valve configuration, arrangement of constant potential members around the vacuum valve, and the like. In the case where the electric discharge occurs between the main circuit of the vacuum valve 4 and the floating potential metal 4g, the potential of the floating potential metal is given by superimposing a discharge pulse on the potential during the normal operation. When the pressure is further increased, the increased discharge pulses are superimposed further so that a final potential of the floating potential metal 4g rises almost to the driving voltage.

In the vacuum breaker 100 having the above-described configuration according to the example, an electrode 12 covered with an insulating material 11 and an electrode 14 covered with an insulating material 13 were disposed on two side surfaces of the insulating frame 7 covering the vacuum valve 4 as illustrated by the sectional view of FIG. 2. Of these electrodes, the electrode 12 is grounded via an impedance 15 (connected to the ground as a voltage clamp). A potential measuring device 16 for measuring a potential of the electrode 12 is connected between the electrode 12 and the impedance 15. The electrode 14 is grounded via a switch 17. The electrode 14 can be grounded by turning on the switch 17. Such a configuration permits the potential measuring device 16 to take measurement of the potential of the electrode 12 relative to the grounded electrode 14 when the switch 17 is turned on. FIG. 2 illustrates the arrangement where the electrode 12 and the electrode 14 are disposed on the two opposed side surfaces of the insulating frame 7 (equal sign shaped arrangement). However, the two electrodes may also be disposed on the side surfaces in vertical relation (L-shaped arrangement). While FIG. 1 and FIG. 2 do not specify the shapes of the electrode 12 and the electrode 14, these electrodes may have any shape so long as each of the electrodes is larger than a shape of the vacuum valve 4 projected on each side surface of the insulating frame 7 and is smaller than each of the side surfaces of the insulating frame 7.

As just described, the pressure monitoring device of the example has the electrode 12 and the electrode 14 disposed on the outer side of the insulating frame 7 so that an insulation distance between these electrodes can be increased. In addition, the electrode 12 and the electrode 14 are individually covered with the insulating materials 11, 13 so that the electric fields on the ends of the electrode 12 and the electrode 14 are limited. Even though these electrodes are disposed, there is established a state where a predetermined insulation performance is retained.

Further, the potential of the floating potential metal 4g disposed in the vacuum valve 4 can be purposefully lowered by turning on the switch 17 connected to the electrode 14. The electric discharge is generated under a pressure lower than an electric discharge pressure when the switch 17 is turned off. That is, the pressure degradation of the vacuum valve 4 can be detected more quickly by turning on the switch 17.

If the pressure is monitored while the vacuum valve 4 is in open state, the following problem may be encountered in a case where pressure rise occurs in the vacuum valve 4. That is, the electricity is discharged from one main circuit on a power source side of the vacuum valve 4 to another main circuit on a load side thereof. Therefore, the execution of the pressure monitoring of the vacuum valve is limited to when the vacuum valve is in closed state so that the safety and reliability of the vacuum valve can be enhanced enough to prevent grounding fault.

The pressure monitoring device according to the example is enhanced in the pressure monitoring accuracy and hence, a vacuum breaker particularly having high reliability in vacuum pressure can be provided. In addition, the insulation distance can be increased because the electrode 12 and the electrode 14 are disposed on the outer side of the insulating frame 7, as described above. What is more, the electrode 12 and the electrode 14 are covered with the insulating materials 11, 13 and hence, the electric fields on the ends of the electrode 12 and the electrode 14 are limited. Therefore, the predetermined insulation performance is not impaired even though the electrode 12 and the electrode 14 are disposed. In this regard as well, enhancement in the insulation reliability can be expected.

Example 2

Next, the description is made on a pressure monitoring device according to Example 2 of the present invention. It is noted that a description of the same or similar components to those of Example 1 is dispensed with.

Figure 3:
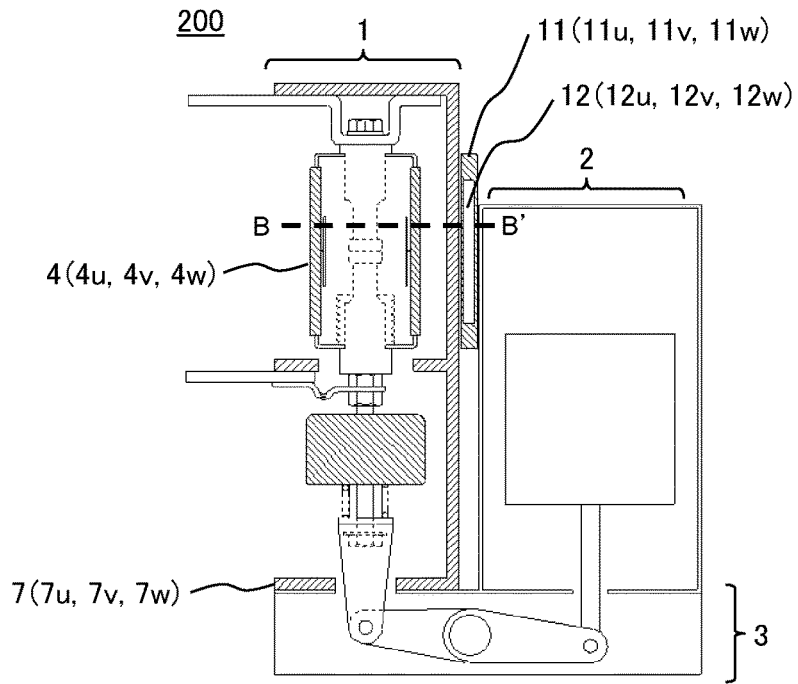
FIG. 3 is a schematic diagram showing a vacuum breaker according to Example 2 hereof.
Figure 4:
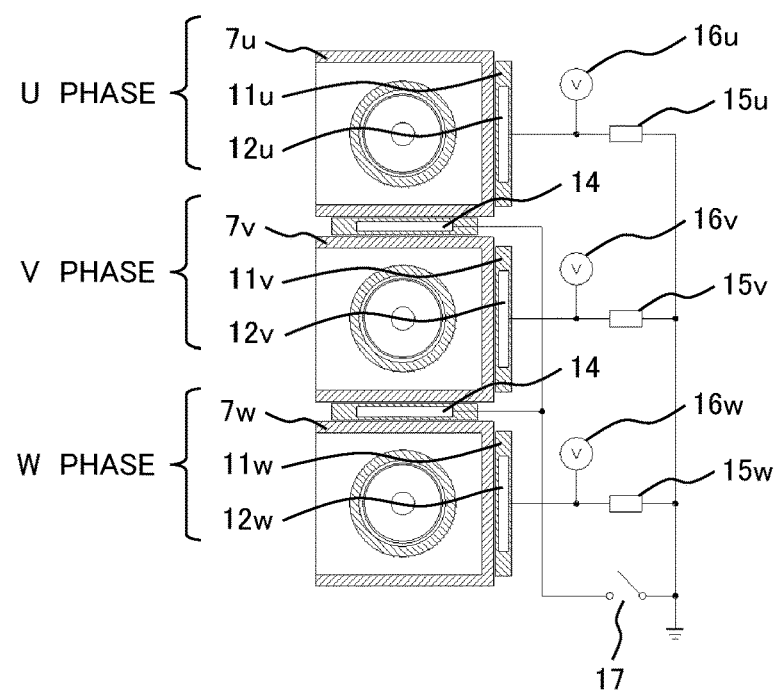
FIG. 4 is a schematic diagram showing a pressure monitoring device according to Example 2 hereof.
Figure 5:
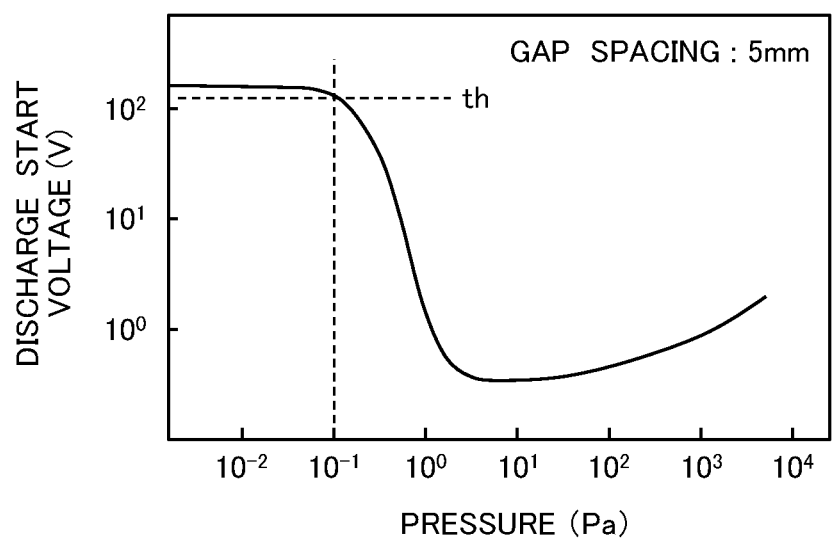
FIG. 5 is a characteristic graph showing correlation between pressure and discharge voltage when a contact spacing is 5 mm.

FIG. 3 and FIG. 4 show a vacuum breaker 200 equipped with a pressure monitoring device according to Example 2. FIG. 3 is a plan view showing an on-state vacuum breaker. FIG. 4 is a sectional view taken on the line B-B' in FIG. 3. As apparent from the comparison between FIG. 2 and FIG. 4, the vacuum breaker 100 of Example 1 is a single-phase vacuum breaker. On the other hand, the vacuum breaker 200 of the example is a three-phase vacuum breaker corresponding to three-phase currents including a U-phase current, a V-phase current and a W-phase current. While the following description is made on assumption that the vacuum breaker 200 is a three-phase vacuum breaker, the vacuum breaker 200 may also be a multiple-phase breaker corresponding to multiple-phase currents other than three-phase currents.

As shown in FIG. 3, the pressure monitoring device of the example includes: the electrodes 12 (12u to 12w) which are covered with the insulating materials 11 (11u to 11w) and disposed between the insulating frames 7 (7u to 7w) and the operation unit case 2c; and the electrodes 14 covered with the insulating material 13 and disposed between the insulating frames 7 of the individual phases.

As shown in FIG. 4, the electrodes 12 (12u to 12w) are grounded via the impedances 15 (15u to 15w), respectively. Each of the potential measuring devices 16 (16u to 16w) for measuring the potential of the electrode 12 is connected in between each pair of the electrode 12 and the impedance 15. According to the example, the pressure of the vacuum valve 4 is monitored when the switch 17 is turned on, just as in Example 1. In the example, the pressure monitoring electrodes 12 (12u to 12w) are provided for the individual phases of the vacuum breaker 200. In the event of an abnormal pressure of the U-phase vacuum valve 4, for example, only the relevant potential measuring device 16u detects the abnormality. Accordingly, the pressure monitoring device of the example can determine which of the vacuum valves 4 for three phases suffers the pressure degradation.

As FIG. 4 shows, the electrodes 14 are disposed between respective pairs of the insulating frames 7u, 7V and the insulating frames 7V, 7w. Furthermore, the electrode 14 may also be disposed on another side surface (an upper side as seen in FIG. 4) of the insulating frame 7u, or another side (a lower side as seen in FIG. 4) of the insulating frame 7w.

REFERENCE SIGNS LIST 100, 200: vacuum breaker
1: main circuit opening/closing part
2: operation mechanism part
2a: operation unit
2b: drive rod
2c: operation unit case
3: link mechanism part
3a: link mechanism part case
3b: shaft
4, 4u, 4v, 4w: vacuum valve
4a: cylindrical insulating material
4b: stationary side end plate
4c: stationary side conductor
4d: movable side end plate
4e: bellows
4f: movable side conductor
4g: floating potential metal
4h: stationary side electrode
4i: movable side electrode
5: movable side connecting conductor
5a: flexible conductor
6: stationary side connecting conductor
7, 7u, 7V, 7W: insulating frame
8: insulating rod,
9: contact pressure spring
10: lever connection fitting
11, 11u, 11V, 11w, 13: insulating material
12, 12u, 12V, 12w, 14: electrode
15, 15u, 15V, 15w: impedance
16, 16u, 16V, 16w: potential measuring device
17: switch

The invention claimed is:

1. A vacuum valve pressure monitoring device which is disposed in a vacuum breaker including: a main circuit opening/closing part including a vacuum valve and an
   insulating frame covering the vacuum valve; and an operation mechanism part for opening/closing a contact of the vacuum valve, the pressure monitoring device comprising:
   a first electrode disposed on one side surface of the insulating frame and grounded via an impedance;
   a second electrode disposed on another side surface of the insulating frame and grounded via a switch; and
   a potential measuring device connected in between the impedance and the first electrode.

2. A vacuum valve pressure monitoring device which is disposed in a multiple-phase vacuum breaker including: a main circuit opening/closing part including, on a per-phase basis, a vacuum valve and an insulating frame covering the vacuum valve; and an operation mechanism part for opening/closing a contact of the vacuum valve, the pressure monitoring device comprising:
- a first electrode for each phase disposed on one side surface of the insulating frame for each phase and grounded via an impedance;
- a second electrode disposed between the adjacent insulating frames and grounded via a switch; and
- a potential measuring device for each phase connected in between the impedance and the first electrode.

3. A method for monitoring vacuum valve pressure of a vacuum breaker including: a main circuit opening/closing part including a vacuum valve and an insulating frame covering the vacuum valve; and an operation mechanism part for opening/closing a contact of the vacuum valve,
- wherein the method is to monitor the degradation of internal pressure of the vacuum valve by taking measurement of a potential between two electrodes in a state where a switch is turned on,
- the two electrodes including: a first electrode disposed on one side surface of the insulating frame and grounded via an impedance; and
- a second electrode disposed on another side surface of the insulating frame and grounded via the switch.

4. A method for monitoring vacuum valve pressure of a multiple-phase vacuum breaker including: a main circuit opening/closing part including, on a per-phase basis, a vacuum valve and an insulating frame covering the vacuum valve; and an operation mechanism part for opening/closing a contact of the vacuum valve,
- wherein the method is to monitor, on a per-phase basis, the degradation of internal pressure of the vacuum valve by taking measurement of a potential between two electrodes in a state where a switch is turned on,
- the two electrodes including a first electrode which is disposed on one side surface of the insulating frame for each phase and grounded via an impedance, and
- a second electrode which is disposed between the adjacent insulating frames and grounded via the switch.

5. The method for monitoring vacuum valve pressure according to claim 3,
- wherein it is determined that the internal pressure of the vacuum valve is degraded when the potential between the two electrodes at the start of electric discharge in the vacuum valve is equal to or more than a predetermined threshold value.

* * * * *